US012334154B2

(12) United States Patent
Tang et al.

(10) Patent No.: US 12,334,154 B2
(45) Date of Patent: Jun. 17, 2025

(54) WRITE-ONCE MEMORY ENCODED DATA (71) Applicant: Micron Technology, Inc., Boise, ID (US)

(72) Inventors: Xiangyu Tang, San Jose, CA (US); Eric N. Lee, San Jose, CA (US); Akira Goda, Setagaya (JP); Kishore K. Muchherla, Fremont, CA (US); Haibo Li, Cupertino, CA (US); Huai-Yuan Tseng, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 17/944,692

(22) Filed: Sep. 14, 2022

(65) Prior Publication Data

US 2023/0395153 A1    Dec. 7, 2023

Related U.S. Application Data (60) Provisional application No. 63/348,435, filed on Jun. 2, 2022.

(51) Int. Cl.
*G11C 7/22* (2006.01)
*G11C 16/08* (2006.01)
*G11C 16/10* (2006.01)
*G11C 16/14* (2006.01)

(52) U.S. Cl.
CPC ............ *G11C 16/102* (2013.01); *G11C 16/08* (2013.01); *G11C 16/14* (2013.01)

(58) Field of Classification Search
CPC ....... G11C 16/102; G11C 16/08; G11C 16/14; G11C 16/16; G11C 11/5628; G11C 16/0483; G11C 16/10; G06F 2212/7208; G06F 12/0246
USPC .................................................. 365/189.011
See application file for complete search history.

(56) References Cited

U.S. PATENT DOCUMENTS

| | | | |
|---|---|---|---|
| 8,914,570 B2 * | 12/2014 | Balakrishnan ...... | G06F 12/0866 711/202 |
| 9,904,492 B2 * | 2/2018 | Seol ..................... | G06F 11/1072 |
| 10,394,489 B2 | 8/2019 | Schuster et al. | |
| 10,521,339 B2 * | 12/2019 | Birk .................... | G06F 12/0246 |
| 2009/0070657 A1 | 3/2009 | Litsyn et al. | |
| 2012/0096328 A1 | 4/2012 | Franceschini et al. | |

\* cited by examiner

*Primary Examiner* — Tha-O H Bui
(74) *Attorney, Agent, or Firm* — Brooks, Cameron & Huebsch, PLLC (57) ABSTRACT A method includes receiving first data, determining a number of programming operations performed on a plurality of flash memory cells subsequent to a most recent erase operation performed on the plurality of flash memory cells, encoding the first data to provide a first write-once memory (WOM) encoded data, and storing the first WOM encoded data, based at least in part on the determined number of programming operations, within a number of the plurality of flash memory cells.

26 Claims, 5 Drawing Sheets

FIG. 1

| BITS | FIRST WOM ENCODED DATA | SECOND WOM ENCODED DATA |
|---|---|---|
| 00 | 000 | 111 |
| 01 | 100 | 011 |
| 10 | 010 | 101 |
| 11 | 001 | 110 |

WRITE-ONCE MEMORY ENCODED DATA

TECHNICAL FIELD

Embodiments of the disclosure relate generally to memory sub-systems, and more specifically, relate to memory sub-system write-once memory (WOM) encoded data.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to memory sub-system write-once memory (WOM) encoded data, in particular to memory sub-systems that include a memory sub-system WOM encoding component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, el alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e . . . g, NAND devices), each plane consists of a set of physical blocks, Each block consists of a set of pages. Each page consists of a set of memory cells ("cells"). A cell is an electronic circuit that stores information, A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells, Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

As mentioned, a SLC can store one bit of information and has two logic states. The two logic states can respectively correspond to two voltage levels (e.g., L0 and L1). After being erased, an SLC cell can be in the L0 state. To store the binary value "0", the SLC cell can be programmed to the L1 state. To store the binary value "1", the SLC cell can be maintained or erased to the L0Mate. However, an erase operation cannot be performed on an individual SLC cell, rather, the erase operation is performed on a group (e.g., block) of SLC cells. It will be appreciated that the levels "L0" and "L1" (as well as higher order levels, such as "L2," L3," etc.) generally represent portions of a voltage distribution curve associated with programming voltages of a memory cell.

During operation, a memory device may have an endurance (e.g., a total amount of data that can be programmed during a useful lifetime of the memory device) that depends, at least in part, on a number of program/erase cycles (PECs) performed on the memory device. As the number of performed PECs is increased to an endurance threshold (e.g., a threshold value at which the memory device has been in operation for greater than a particular period of time and has therefore likely been exposed to a relatively large quantity of PECs), a bit-error rate (BER) can also increase towards an unacceptable level. As an example, after each PEC, a. SLC NAND memory cell is worn, such that the voltage distributions corresponding to the L0 and L1 levels can become closer together (e.g., the peaks of the voltage distributions corresponding to L0 and L1 can drift an/or shift over time). Over an increasing number of PECs, L0 and L1 can become so close together that determining whether the binary value "0" or "1" is stored may be increasingly difficult and thus increase the BER.

Reducing a total number of erases between programming operations, within the lifespan (or useful lifetime) of the memory device, can help to extend the memory device lifespan by reducing the BER, for instance. Extending the memory device lifespan, by reducing the total number of erases between programming operations, increases the total bits written (TBW) of the memory device.

Additionally, the present disclosure provides that multiple programming operations can be performed (e.g., on a NAND block) without performing an erase operation between the individual programming operations. Performing multiple programming operations without performing an erase operation between the individual programming operations increases endurance of the memory device. Utilizing WOM encoded data with a memory device having SLC memory cells can reduce a total number of erases between programming operations.

Figure 1:
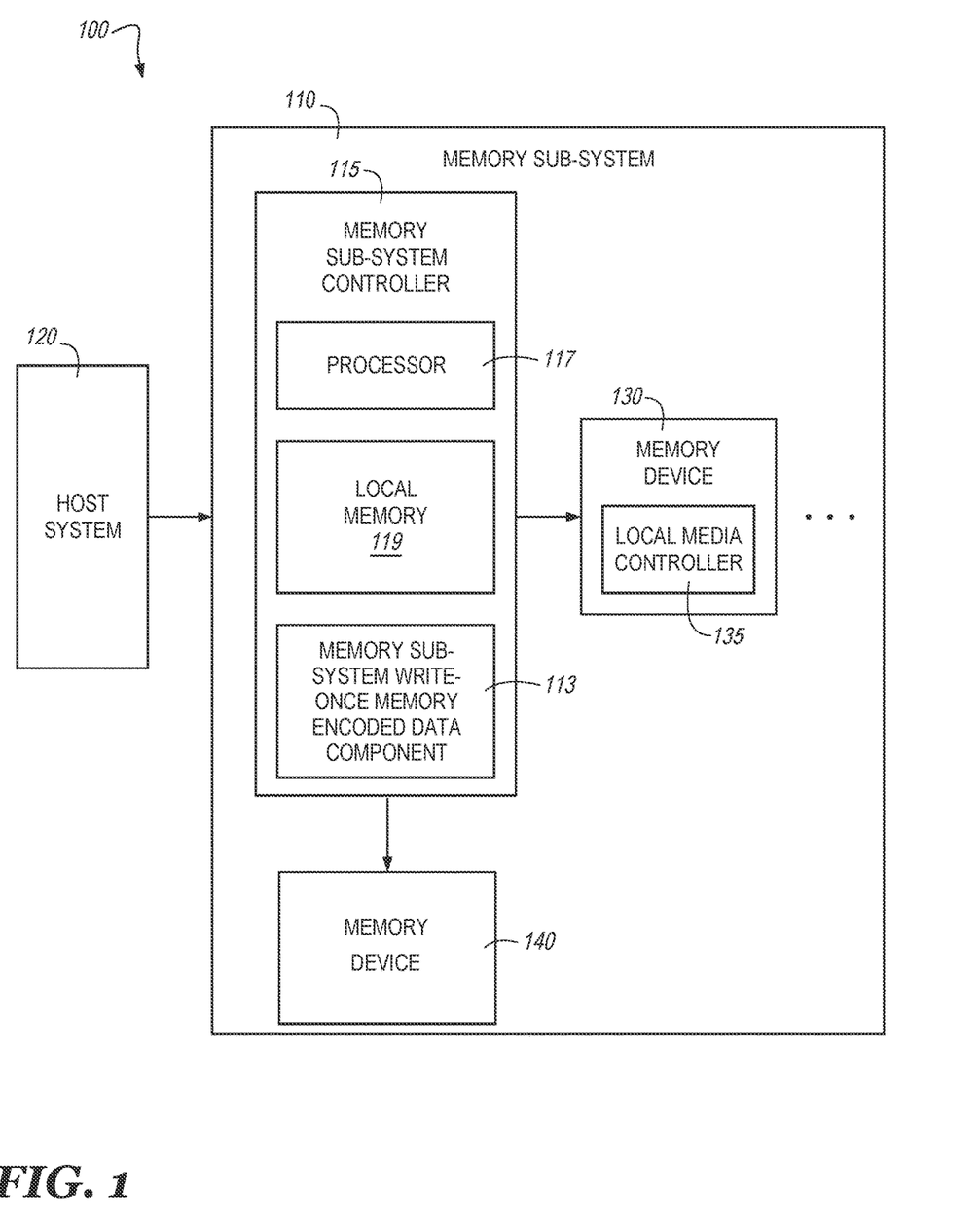
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DE MI (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM)ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LISA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed. NAND (MNAND) device.

The memory sub-system 110 can include a WOM encoded data component 113. Although not shown in FIG. 1 so as to not obfuscate the drawings, the WOM encoded data component 113 can include various circuitry to facilitate encoding data to provide WOM encoded data for a memory sub-system and/or components of the memory sub-system, determining a number of programming operations performed on a plurality of flash memory cells subsequent to a most recent erase operation performed on the plurality of flash memory cells, and/or storing the WOM encoded data, based at least in part on the determined number of programming operations, within a number of the plurality of flash memory cells. In some embodiments, the WOM encoded data component 113 can include special purpose circuitry in the form of an ASIC, FPGA, state machine, and/or other logic circuitry that can allow the WOM encoded data component 113 to orchestrate and/or perform operations described herein that can involve the memory device 130 and/or the memory device 140.

In some embodiments, the memory sub-system controller 115 includes at least a portion of the WOM encoded data component 113. For example, the memory sub-system controller 115 can include a processor 117 (processing device) configured to execute instructions stored in local memory 119 for performing the operations described herein. In some embodiments, the WOM encoded data component 113 is part of the host system 110, an application, or an operating system.

In a non-limiting example, an apparatus the computing system 100) can include a memory sub-system WOM encoded data component 113. The memory sub-system WOM encoded data component 113 can be resident on the memory sub-system 110. As used herein, the term "resident on" refers to something that is physically located on a particular component. For example, the memory sub-system WOM encoded data component 113 being "resident on" the memory sub-system 110 refers to a condition in which the hardware circuitry that comprises the memory sub-system WOM encoded data component 113 is physically located on the memory sub-system 110. The term "resident on" may be used interchangeably with other terms such as "deployed on" or "located on," herein.

The memory sub-system WOM encoded data component 113 can be configured to receive first data; encode the first data, based at least in part, on a first counter value, to provide a first write-once memory (WOM) encoded data; store the first WOM encoded data within a number of a plurality of flash memory cells of the memory sub-system; receive second data; encode the second data, based at least in part, on a second counter value, to provide a second WOM encoded data, wherein the second counter value is different from the first counter value; store the second WOM encoded data within the number of the plurality of flash memory cells of the memory sub-system; and change the second counter value to the first counter value subsequent to storing the second WOM encoded data. As described above, the memory components can be memory dice or memory packages that form at least a portion of the memory device 130 and/or the memory device 140.

In another non-limiting example, a system (e.g., the computing system 100) can include a memory sub-system 110 comprising memory components arranged to form a stackable cross-gridded array of memory cells. A processing device (e.g., the memory sub-system WOM encoded data component 113, the processor 117 and/or the local media controller 135) can be coupled to the memory components and can perform operations comprising receiving first data, determining a number of programming operations performed on a plurality of flash memory cells subsequent to a most recent erase operation performed on the plurality of flash memory cells, encoding the first data to provide a first WOM encoded data, and storing the first WOM encoded data, based at least in part on the determined number of programming operations, within a number of the plurality of flash memory cells.

Figure 2:
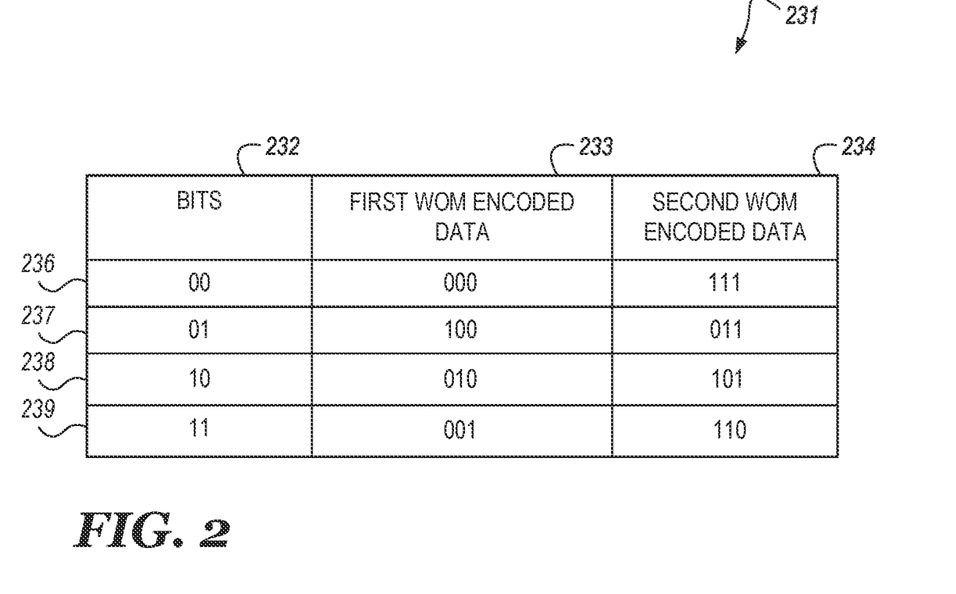
FIG. 2 illustrates a table including an example of WOM encoded data.

FIG. 2 illustrates a table 231 including an example of WOM encoded data. Table 231 includes: column 232, which is labeled "Bits"; column 233, which is labeled "First WOM. Encoded Data"; column 234, which is labeled "Second WOM Encoded Data"; row 236, which corresponds to bits "00"; row 237, which corresponds to bits "01"; row 238, which corresponds to bits "10"; and row 239, which corresponds to bits "11". For the example illustrated in FIG. 2, two bits (e.g., data) that correspond to the values shown in column 232 can be stored by three memory cells (e.g., SLC cells) that correspond to the values shown in column 233 and column 234, respectively; however, embodiments are not so limited.

Embodiments of the present disclosure provide that bits (e.g., data as shown in column 232) can be encoded as either First WOM Encoded Data, as shown in column 233 or Second WOM Encoded Data, as shown in column 234. For the WOM encoding, a number of memory cells (e.g., SLC cells) can each be at an erased state (e.g., L0). Because the number of memory cells are each at an erased state, bits 232 are encoded to provide First WOM Encoded Data 233. In other words, First WOM Encoded Data 233 values are provided when the memory cells are each at the erased state. For example, when each of the number of memory cells are at an erased state data corresponding to bit "00" shown in row 236 are to be encoded, the First WOM Encoded Data ("000") shown in row 236 is provided; data corresponding to bit "01" shown in row 237 are to be encoded, the First WOM Encoded Data ("100") shown in row 237 is provided; data corresponding to bit "10" shown in row 238 are to be encoded, the First WOM Encoded Data ("010") shown in row 238 is provided; and data corresponding to bit "11" shown in row 239 are to be encoded, the First WOM Encoded Data ("001") shown in row 239 is provided.

One or more embodiments of the present disclosure provide that a number of programming operations performed subsequent to the most previously performed erase operation can be monitored (e.g., tracked). The number of programming operations performed subsequent to the most previously performed erase operation can be monitored a plurality of times (e.g., the monitoring, as well as one or more other operations discussed herein may be repeated a number of time). The monitoring of the number of programming operations performed subsequent to the most previously performed erase operation can be utilized to determine the bits that are to be encoded as First WOM Encoded Data or Second WOM Encoded Data. For instance, when it is determined that each of the memory cells (e.g., each memory cell of a NAND block that, for instance, includes SLC cells) is at an erased state, a counter can have a first value (e.g. 0), which can indicate that First WOM Encoded Data will be utilized. After the bits are encoded as First WOM Encoded Data and the First WOM Encoded Data is stored, the counter can be incremented to a second value (e.g., 1), which can indicate that Second WOM Encoded Data will be utilized. After the bits are encoded as Second WOM Encoded Data and the Second WOM Encoded Data is stored, the counter can be returned to a first value (e.g., 0), as both First WOM Encoded Data and Second WOM Encoded Data has been encoded. The counter may store a 1-bit value, and/or be a flip-flop register, among other counters. The counter may be implemented at various places and/or various components, such as on a controller or a NAND block, for instance. One or more embodiments of the present disclosure provide that when the monitoring of the number of programming operations performed subsequent to the most previously performed erase operation, as well as one or more operations discussed herein, is repeated, the counter can be continuously incremented to further values. One or more embodiments of the present disclosure provide that an erase operation can be performed (e.g., on a plurality of SLC memory cells) when a counter value is equal to an erase value. Embodiments provide that the erase value can have different values for various applications. One or more embodiments provide that programming operation may be performed until the erase value is reached.

As an example, when the counter has a 0 value (e.g., no programming operations have been performed on a number of memory cells subsequent to the most previously performed erase operation) the bits "00", shown in row 236, are to be stored within the number of memory cells (e.g., three SLC cells) and thereafter the bits "10", shown in row 236, are to be stored within the number of memory cells, the bits "00" will be encoded as First WOM Encoded Data 233, corresponding to "000", as shown in row 236, and be stored (e.g., via a write programming operation) with the number of memory cells. After the First WOM Encoded Data ("000") is stored, and prior to a subsequent programming operation with the number of memory cells, the counter can be incremented from the 0 value to a 1 value.

As mentioned for this example, after the bits "00" are stored, the bits "10" are to be stored. As the counter has been incremented from the 0 value to the 1 value, Second WOM Encoded. Data 234, rather than First WOM Encoded Data 233, is utilized. As shown in row 238, the Second WOM Encoded Data 234, corresponds to "101". The Second WOM Encoded Data ("101") can then be stored within the number of memory cells. After the Second WOM Encoded Data ("101") is stored, the counter can be changed from the 1 value back to the 0 value (e.g., flip-flopped), as both the First WOM Encoded Data 233 and the Second WOM Encoded Data 234 have been utilized. One or more embodiments provide that in transitioning from storing the First WOM Encoded Bata ("000") to storing the Second WOM Encoded Data ("101"), none of the number of memory cells changes from the 1 value to the 0 value. For instance for this example, for the First WOM Encoded Data ("000") a first SLC cell can store a "0" value, a second SLC cell can store a "0" value, and a third SLC cell can store a "0" value; then for the Second WOM Encoded Data ("101") the first SLC cell can store a "1" value, the second SLC cell can store a "0" value, and the third SLC cell can store a "1" value.

As another example, when the counter has a 0 value (e.g., no programming operations have been performed on a number of memory cells subsequent to the most previously performed erase operation) the bits "01", shown in row 236, are to be stored within the number of memory cells (e.g., three SLC cells) and thereafter the bits "01", also shown in row 236, are to be stored within the number of memory cells, the bits "01" will be encoded as First WOM Encoded Data 233, corresponding to "100", as shown in row 236, and be stored (e.g., via a write programming operation) with the number of memory cells. After the First WOM Encoded Data ("100") is stored, and prior to a subsequent programming operation with the number of memory cells, the counter can be incremented from the 0 value to a 1 value.

However, for this example, it is noted that the Second WOM. Encoded Data 234, corresponding to bits "01", shown in row 236 is "011". Because the number of memory cells are ineligible to change from the 1 value to the 0 value for the WOM encoding, the Second WOM. Encoded Data 234, corresponding to bits "01", shown in row 236 of "011" will not be utilized. In other words, for First WOM Encoded Data ("100"), a first SLC cell can store a "1" value and for the Second WOM Encoded Data ("011"), if utilized, the first SLC cell would need to store a "0" value, which is ineligible for the WOM encoding as none of the number of memory cells are changeable from the 1 value to the 0 value for the WOM encoding.

One or more embodiments provide that that the first data and the second data (e.g., "01" and "01", as respectively discussed for this example, can be compared to determine if the first data and the second data are identical. In this example, the first data and the second data can be determined to be identical (e.g., both are respectively "01"). Other identical data include: first data and second data both corresponding to "00"; first data and second data both corresponding to "10"; and first data and second data both corresponding to "11", for instance. When the first data and the second data are determined to be identical, the Second WOM Encoded Data can be identical to the First Encoded WOM Data. In other words, the First Encoded WOM Data may be maintained (e.g., stored by the number of memory cells). For instance, for this example, the first data "01" may be stored as "100" and the second data "01" may also be stored as "100". One or more embodiments provide that that when the first data and the second data are determined to be identical, the counter can be incremented from the 0 value to a 1 value after the second data is stored and prior to a subsequent erase operation.

Figure 3A:
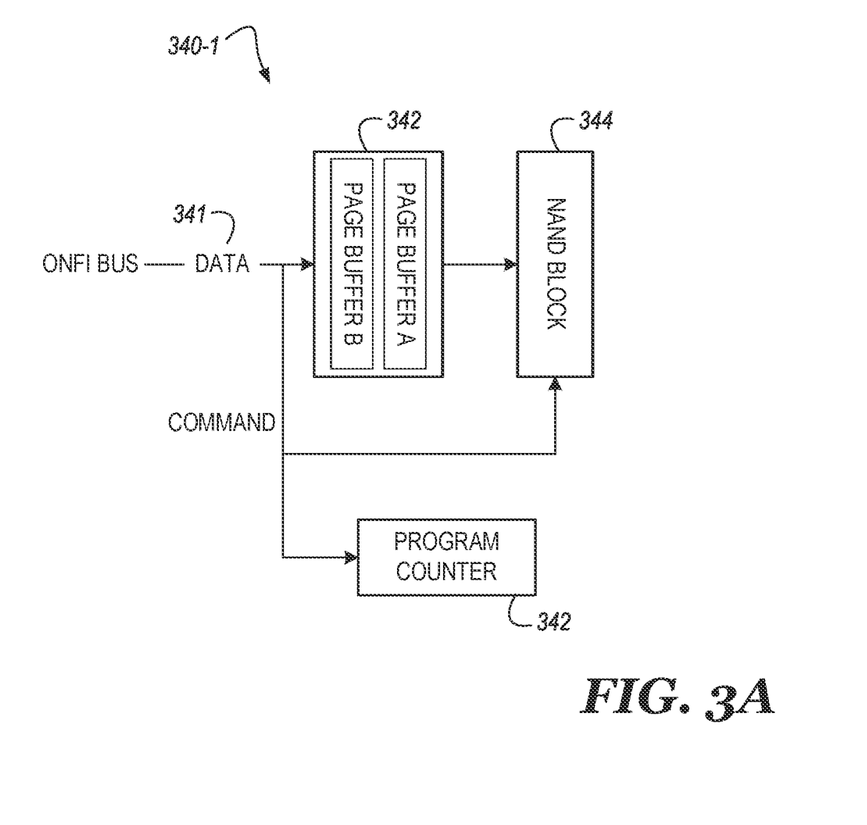
FIG. 3A is a block diagram of portion an example computer system in which embodiments of the present disclosure may operate.

Subsequently to receiving the first data and the second data, providing WOM encoded Data corresponding to the first data and the second data, storing the respective WOM encoded. Data, and sensing the respective WOM encoded Data, an erase operation may be performed on the memory cells storing the WOM encoded Data. As an erase operation has occurred, the counter will have a 0 value, and additional data can be received. For example; third data, which may be processed similarly to the first data as previously discussed, may be received, and fourth data; which may be processed similarly to the second data as previously discussed, may be received, and so forth, FIG. 3A is a block diagram of portion an example computer system 340-1 in which embodiments of the present disclosure may operate. As shown in FIG. 3A, data 341 (e.g., first data, second data, etc.) can be provided to a computer system component 342 (e.g., from an interface, such as ONFI). One or more embodiments provide that data 341 may be provided from a computer system component (not shown in FIG. 3A, such as a host (e the host system 120 of FIG. 1) and/or a controller (e.g. the memory sub-system controller 115 of FIG. 1). The counter 342 (e.g., and/or flip-flop, as previously discussed with FIG. 2) may be directly coupled to data 341 line, such that the counter is configured to change values (or flip-flop) upon data being provided to the computer system component 342, which may be referred to as a program counter. The flip-flop can be a component (e.g., circuit) that responds to a signal to provide a particular value (e.g., "I" or "0") based upon the signal. One or more embodiments provide that the counter 342 can be located on a NAND die. However, embodiments are not so limited. One or more embodiments provide that the counter 342 can be implemented on (e.g., within) a controller (e.g., a SSD controller). When the counter 342 is implemented on a controller, a number of other computer system components (e.g., a low-density parity-check (LDPC) encoder and/or a LDPC decoder) may be utilized.

While FIG. 3A illustrates computer system component 342 as a single component, embodiments are not so limited, and computer system component 342 may include a plurality of computer system components. Computer system component 342 can include a number of buffers (e.g., a number of page buffers), among other computer system components. As shown in FIG. 3A, the computer system component 342 may be coupled to computer system component 344 (e.g., a NAND block).

Figure 3B:
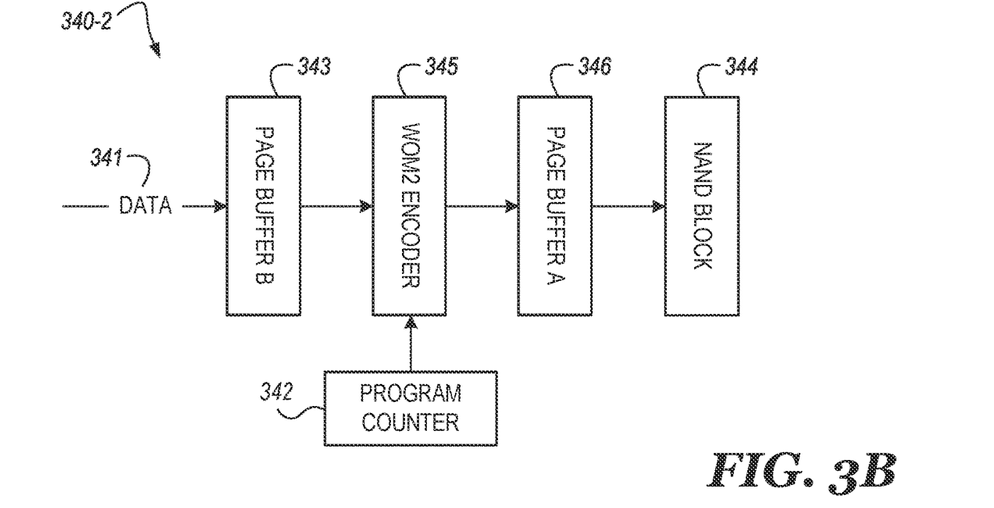
FIG. 3B is a block diagram of portion an example computer system in which embodiments of the present disclosure may operate.

FIG. 3B is a block diagram of portion an example computer system 340-2 in which embodiments of the present disclosure may operate. As shown in FIG. 3B, data 341 can be received by a computer system component 343 (e.g., a page buffer) and thereafter a by computer system component 345 (e.g., a WOM encoder).

Computer system component 345 (e.g., WOM encoder) can be configured to provide WOM encoded data (e.g., the First WOM Encoded Data, as previously discussed). Embodiments provide that that the computer system component 345 can be provided on die, hardware, and/or firmware, for instance. One or more embodiments provide that the counter 342 (e.g., as previously discussed) may be directly coupled to computer system component 345, such that the counter 342 is configured to change values (or flip-flop) upon data being provided to the computer system component 345 or from the computer system component 345.

From computer system component 345, the flow shown in FIG. 3B may continue to a computer system component 346 (e.g., a page buffer) and thereafter to a computer system component 344 (e.g., a NAND block). The computer system component 344 can include a plurality of memory cells (e.g., SLC memory cells), WOM encoded data (e.g., from computer system component 345 and/or computer system component 346) can be directed to the computer system component 344 (e.g., for storage by a programming operation).

Figure 3C:
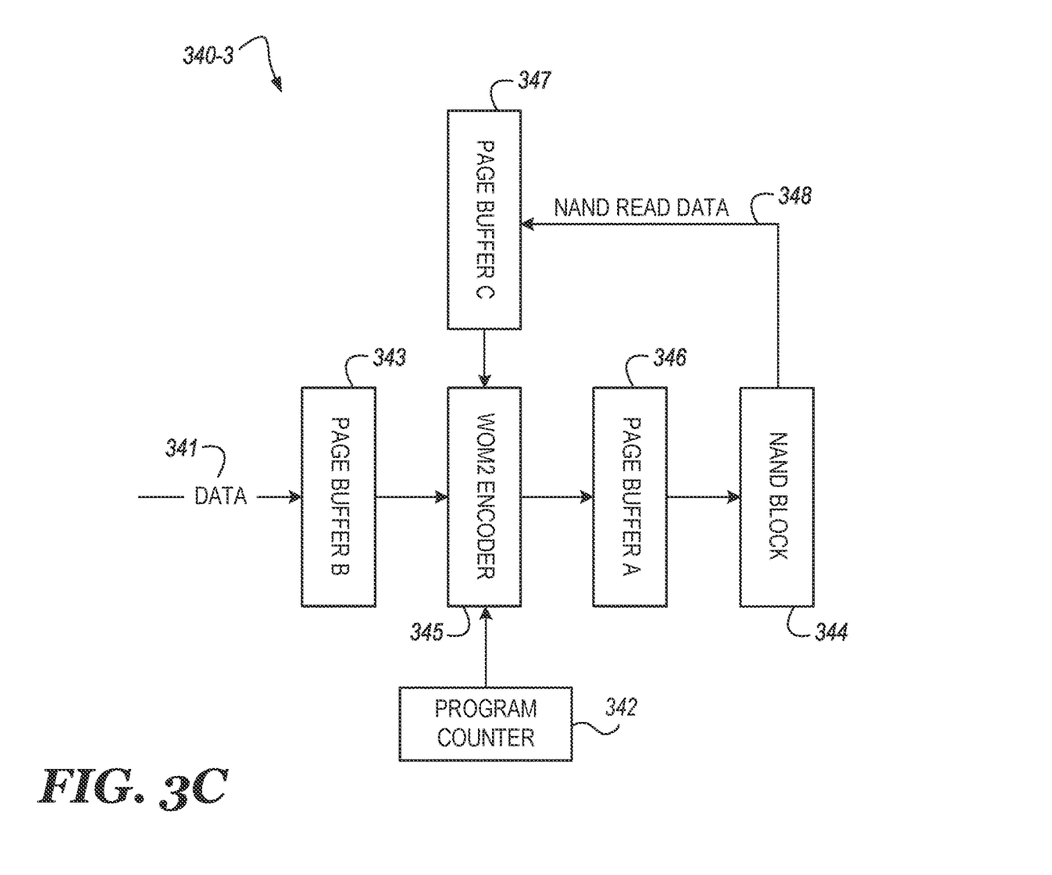
FIG. 3C is a block diagram of portion an example computer system in which embodiments of the present disclosure may operate.

FIG. 3C is a block diagram of portion an example computer system 340-3 in which embodiments of the present disclosure may operate. As shown in FIG. 3C, data 341 can be received by a computer system component 343 (e.g., a page buffer) and thereafter a by computer system component 345 (e.g., a WOM encoder), As the encoding for the second WOM encoded data can utilize the current state of the memory cells (e.g., SLC memory cells of computer system component 344), the states (e.g., voltage levels) of the memory cells can be determined (e.g., by a sense operation). The determined states of the memory cells can be stored in a computer system component 347 (e g a page buffer).

One or more embodiments provide that the determined states of the memory cells, which are determined from computer system component 344 (e.g. determined by a sense operation), can be compared to new data received by computer system 340. For instance, First WOM Encoded Data (corresponding to bits "01") can be determined from computer system component 344 and compared to new data. One or more embodiments provide that the computer system component 345 (e.g., WOM encoder) can be configured to compare the WOM Encoded Data determined from computer system component 344 and the new data. If the new data is identical to the First WOM Encoded Data, then rather than providing Second WOM Encoded Data for the new data, the First WOM Encoded Data may be maintained. Maintaining the First WOM Encoded Data can provide that an ineligible value for the WOM encoding is not utilized, as previously mentioned. One or more embodiments provide that a feedback loop 348 (as shown in FIG. 3C) may be utilized to compare the WOM Encoded Data determined from computer system component 344 and the new data, for instance.

One or more embodiments provide that the Second WOM Encoded Data for the new data is encoded subsequently to determining the current state of a number of memory cells of computer system component 344. For example, if the counter 342 has a current value of "1", the voltage levels of a number of memory cells of computer system component 344 can be determined (e.g., by a sense operation). The respective current states of the number of memory cells of computer system component 344 can be stored (e.g., within a page buffer 347). Then, based, at least in part, on the respective current states of the number of memory cells of computer system component 344 and the new data to be encoded, WOM encoded data can be generated and stored within the page buffer, from which the WOM encoded data can be directed to the computer system component 344 for storage. As such, one or more embodiments provide that the computer system component 345 (e.g., WOM encoder) can be a combinatorial component (e.g., a combinatorial circuit).

Figure 3D:
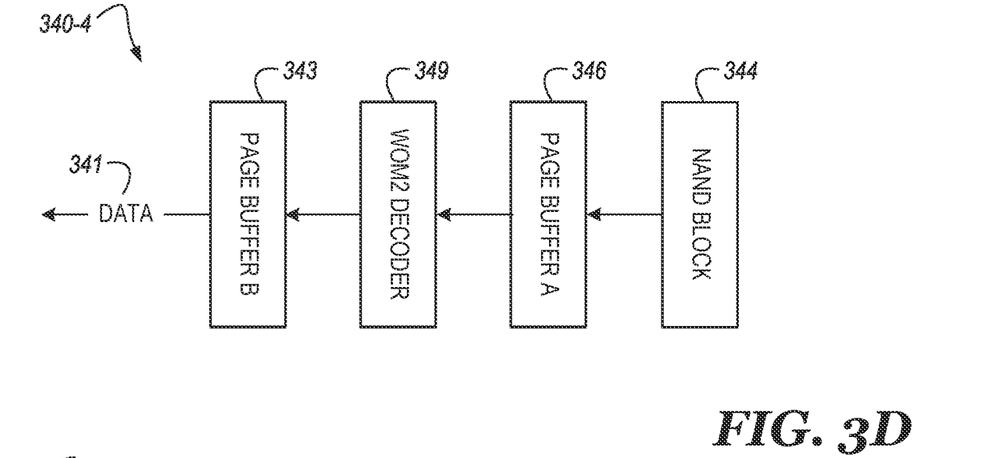
FIG. 3D is a block diagram of portion an example computer system in which embodiments of the present disclosure may operate.

FIG. 3D is a block diagram of portion an example computer system 340-4 in which embodiments of the present disclosure may operate. One or more embodiments provide that data can be determined (e.g., by a sense operation) from computer system component 344 by decoding. For instance, WOM Encoded Data can be obtained from computer system component 344 and be directed to a computer system component 349 (e.g., a WOM decoder). One or more embodiments provide that the computer system component 349 can be configured to decode WOM encoded data. One or more embodiments provide that a lookup table may be utilized for decoding WOM encoded data. For instance, a same lookup table may be utilized to decode the first WOM encoded data and the second WOM encoded data. Decoded WOM encoded data can be directed (e.g., provided to) to a controller (not shown in FIG. 3D), for example. One or more embodiments provide that the computer system component 349 (e.g., WOM decoder) can be located on a NAND die. As such, decoding the WOM encoded data can be transparent to a host user.

Figure 4:
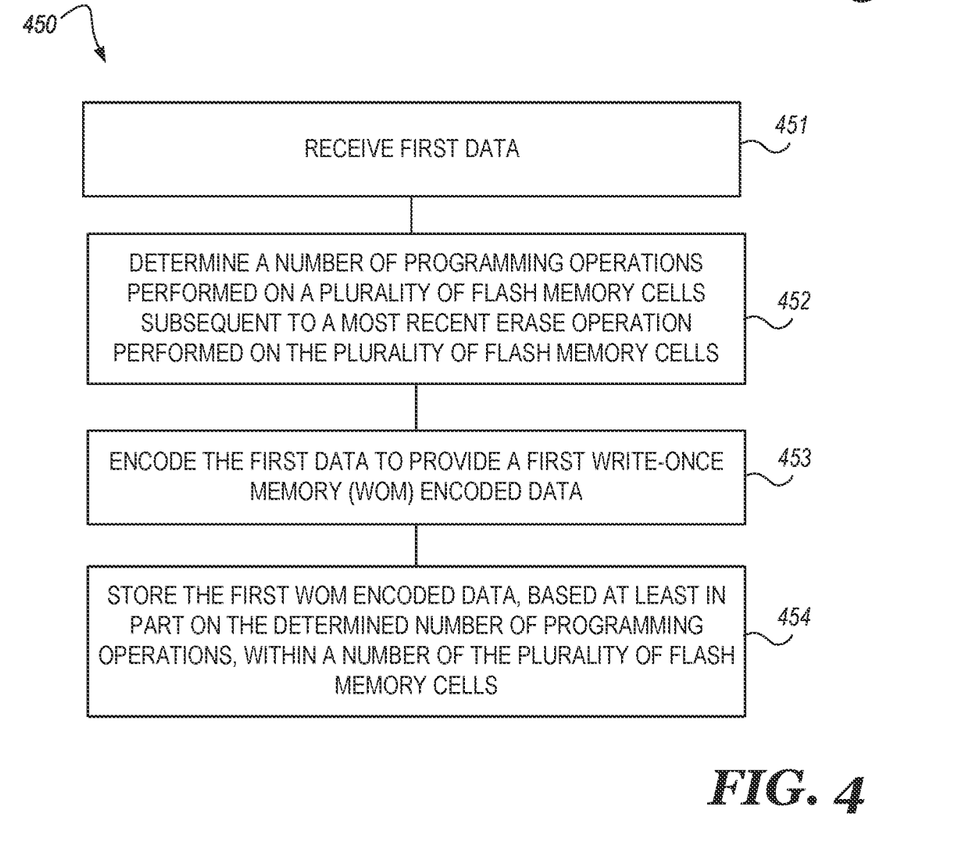
FIG. 4 is a flow diagram corresponding to a method for memory sub-system temperature throttling relaxation in accordance with some embodiments of the present disclosure.

FIG. 4 is flow diagram corresponding to a method 450 for WOM encoded data in accordance with some embodiments of the present disclosure. The method 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the WOM encoded data component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 451, the method 450 can include receiving first data. The first data can correspond to bits (e.g., "00", "01", "10", "11"), as discussed with FIG. 2.

At block 452, the method 450 can include determining a number of programming operations performed on a plurality of flash memory cells subsequent to a most recent erase operation performed on the plurality of flash memory cells. This determination may be utilized to determine whether subsequently provided WOM encoded data will be First WOM Encoded Data or Second WOM Encoded Data. For example, if the number of programming operations performed on a plurality of flash memory cells subsequent to a most recent erase operation performed on the plurality of flash memory cells is zero, then the subsequently provided WOM encoded data can be First WOM Encoded Data; if the number of programming operations performed on a plurality of flash memory cells subsequent to a most recent erase operation performed on the plurality of flash memory cells is one, then the subsequently provided WOM encoded data can be Second WOM Encoded Data.

At block 453, the method 450 can include encoding the first data to provide a first write-once memory (WOM) encoded data. As discussed with FIG. 2, embodiments of the present disclosure provide that data (e.g., bits) can be encoded as either First WOM Encoded Data or Second WOM Encoded Data.

At block 454, the method 450 can include storing the first WOM encoded data, based at least in part on the determined number of programming operations, within a number of the plurality of flash memory cells. The number of programming operations performed subsequent to the most previously performed erase operation can be utilized, at least in part, to determine whether the bits are to be encoded as First WOM Encoded Data or Second WOM Encoded Data. As mentioned, when it is determined that each of the memory cells is at an erased state First WOM Encoded Data can be utilized.

In some embodiments, the method 450 can include receiving second data. The second data can correspond to bits (e.g., "00", "01", "10", "11"), as discussed with FIG. 2.

In some embodiments, the method 450 can include determining, subsequent to storing the first WOM encoded data, the number of programming operations performed on the plurality of flash memory cells subsequent to the most recent erase operation performed on the number of flash memory cells. As mentioned, this determination may be utilized to determine whether subsequently provided WOM encoded data will be First WOM Encoded Data or Second WOM Encoded Data.

In some embodiments, the method 450 can include determining a data state for each of the number of flash memory cells (e.g., current data stored in NAND). As mentioned, embodiments provide that memory cells are ineligible to change from a particular data state (e.g., a 1 value) to another particular data state (e.g., a 0 value) for the WOM encoding. Also, the determined data state for each of the number of flash memory cells can be compared with new data based, at least in part, on a present counter value to generate the WOM encoded data.

In some embodiments, the method 450 can include encoding the second data, based at least in part, on the data state for each of the number of flash memory cells, to provide a second WOM encoded data. As mentioned, the Second WOM Encoded Data can be identical to the First Encoded WOM Data (e.g., the First Encoded WOM Data may be maintained) or the Second WOM Encoded Data can be different than the First Encoded WOM Data. In some embodiments, the method 450 can include storing the second WOM encoded data with the number of the plurality of flash memory cells.

Figure 5:
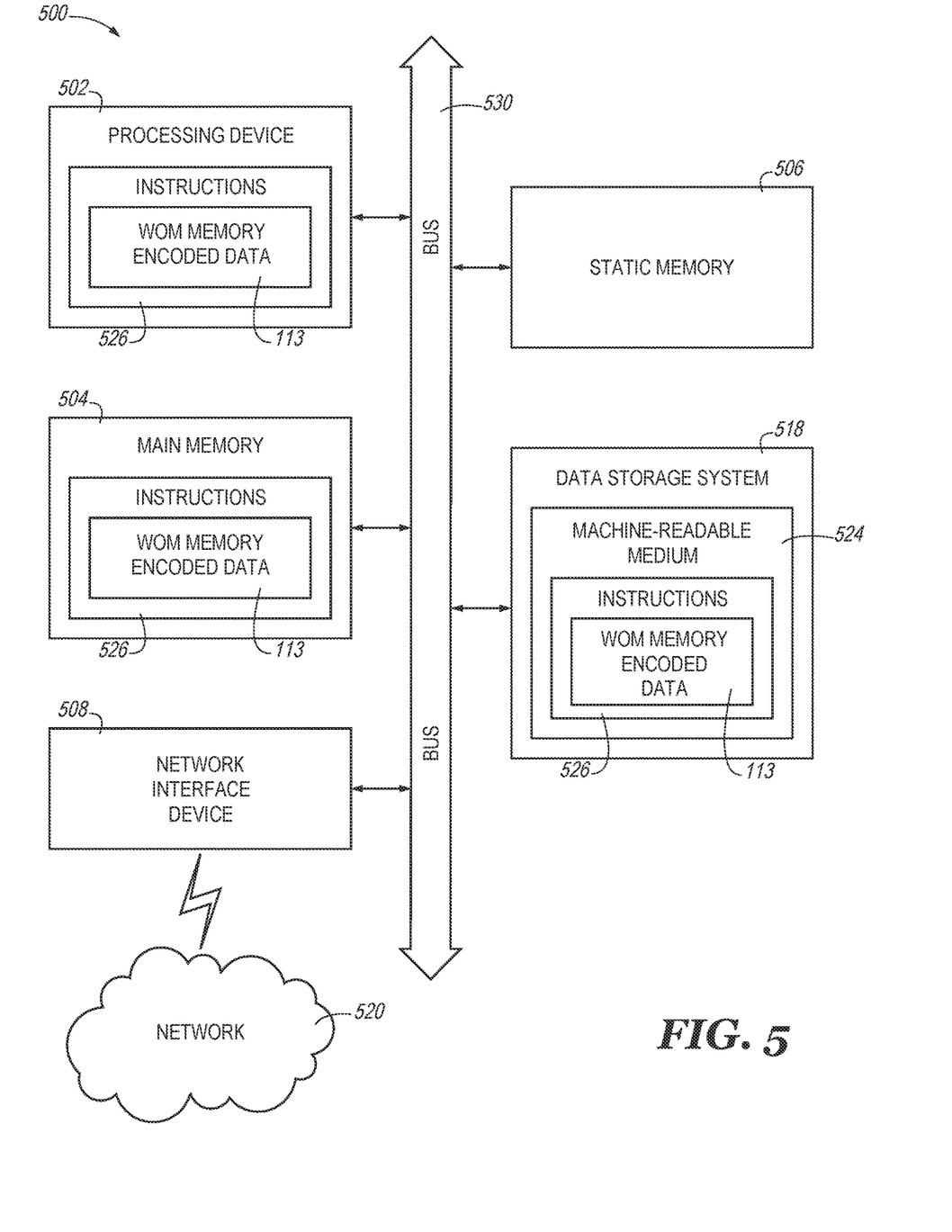
FIG. 5 is a block diagram of an example computer system in which embodiments of the present disclosure may operate.

FIG. 5 is a block diagram of an example computer system 500 in which embodiments of the present disclosure may operate. FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the WOM encoded data component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a WOM encoded data component (e.g., the WOM encoded data component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising: receiving first data; determining a number of programming operations performed on a plurality of flash memory cells subsequent to a most recent erase operation performed on the plurality of flash memory cells based on a first counter value, wherein the first counter value indicates the number of programming operations performed on the plurality of flash memory cells;
   determining a write-once memory (WOM) encoding to apply to the first data based on the first counter value;
   encoding the first data to provide a WOM encoded data based on the determined; and
   storing first WOM encoded data, based at least in part on the determined number of programming operations and the first counter value, within a number of the plurality of flash memory cells.

2. The method of claim 1, further comprising:
   receiving second data;
   determining, subsequent to storing the first WOM encoded data, the number of programming operations performed on the plurality of flash memory cells subsequent to the most recent erase operation performed on the number of flash memory cells based on a second counter value;
   determining a data state for each of the number of flash memory cells;
   encoding the second data, based at least in part, on the data state and the second counter value for each of the number of flash memory cells, to provide a second WOM encoded data; and
   storing the second WOM encoded data within the number of the plurality of flash memory cells.

3. The method of claim 1, wherein each of the plurality of memory cells is a single level cell (SLC).

4. The method of claim 2, wherein the first WOM encoded data and the second WOM encoded data are identical.

5. The method of claim 2, wherein the first WOM encoded data and the second WOM encoded data are different.

6. The method of claim 1, wherein the number of the plurality of flash memory cells is three.

7. An apparatus, comprising:
   a write-once memory (WOM) encoded data component configured to:
   receive first data;
   determine a first counter value associated with a plurality of flash memory cells, wherein the first counter value indicates a number of programming operations performed on the plurality of flash memory cells;
   determine a first WOM encoding to apply to the first data based on the determined first counter value;
   encode the first data, based at least in part, on the first counter value to provide a first WOM encoded data based on the determined first WOM;
   store the first WOM encoded data within a number of the plurality of flash memory cells of a memory sub-system;
   receive second data;
   determine a second counter value associated with the plurality of flash memory cells, wherein the second counter value indicates that the plurality of flash memory cells are encoded as first WOM encoded data;
   determine a second WOM encoding to apply to the second data based on the determined second counter value;
   encode the second data, based at least in part, on the second counter value, to provide a second WOM encoded data based on the determined second write-once memory encoding, wherein the second counter value is different from the first counter value;
   store the second WOM encoded data within the number of the plurality of flash memory cells of the memory sub-system; and
   change the second counter value to the first counter value subsequent to storing the second WOM encoded data.

8. The apparatus of claim 7, wherein the first data comprises two bits and the second comprises two bits.

9. The apparatus of claim 7, wherein the WOM encoded data component is further configured to determine that the first data and the second data are identical.

10. The apparatus of claim 9, wherein the first WOM encoded data and the second WOM encoded data are identical when the first data and the second data are identical.

11. The apparatus of claim 7, wherein the WOM encoded data component is further configured to determine that the first data and the second data are different.

12. The apparatus of claim 11, wherein the first WOM encoded data and the second WOM encoded data are different when the first data and the second data are different.

13. The apparatus of claim 7, wherein the memory subsystem includes a NAND device comprising the plurality of flash memory cells.

14. A system, comprising:
a plurality of memory components comprising an array of memory cells; and
a processing device coupled to the plurality of memory components, wherein the processing device is configured to:
receive first data;
determine a first counter value associated with the array of memory cells, wherein the first counter value indicates a number of programming operations performed on the array of memory cells;
determine a first write-once memory (WOM) encoding to apply to the first data based on the determined first counter value;
encode the first data, based at least in part, on the first counter value, to provide a first WOM encoded data based on the determined first write-once memory;
store the first WOM encoded data within a plurality of single level cells (SLC) of the array of memory cells;
receive second data;
determine a second counter value associated with the array of memory cells, wherein the second counter value indicates the array of memory cells are encoded as first WOM encoded data;
determine a second WOM encoding to apply to the second data based on the determined second counter value;
encode the second data, based at least in part, on the second counter value, to provide a second WOM encoded data based on the determined second write-once memory, wherein the second counter value is different from the first counter value; and
store the second WOM encoded data within the plurality of SLC memory cells;
perform an erase operation on the plurality of SLC memory cells;
receive third data;
encode the third data, based at least in part, on the first counter value, to provide a third WOM encoded data; and
store the third WOM encoded data within the plurality of SLC memory cells.

15. The system of claim 14, wherein the processing device is configured to:
receive fourth data;
encode the fourth data, based at least in part, on the second counter value, to provide a fourth WOM encoded data; and
store the fourth WOM encoded data within the number of the plurality of SLC memory cells.

16. The system of claim 15, wherein the first WOM encoded data, the second WOM encoded data, the third WOM encoded data, and the fourth WOM encoded data are stored within a group of the plurality of SLC cells.

17. The system of claim 16, wherein the group of the plurality of SLC cells includes three SLC cells.

18. The system of claim 14, wherein the processing device is configured to decode the first WOM encoded data and the second WOM encoded data utilizing a same lookup table.

19. The system of claim 14, wherein the processing device is configured to compare the first data and the second data to determine if the first data and the second data are identical or not.

20. The system of claim 19, wherein encoding the second data is based, at least in part, on if the first data and the second data are the same or not.

21. The system of claim 14, wherein the processing device is configured to determine a data state for each of the plurality of SLC memory cells subsequent to determining the second counter value, and encoding the second data is based, at least in part, on the data state for each of the plurality of SLC memory cells, to provide the second WOM encoded data.

22. The system of claim 14, wherein the processing device is configured to perform an erase operation on the plurality of SLC memory cells when a counter value is equal to an erase value.

23. A method, comprising:
determining a counter value associated with a plurality of memory cells of a NAND block, wherein the counter value indicates a number of programming operations performed on the plurality of memory cells of the NAND block;
performing a sense operation on the plurality of memory cells of the NAND block to determine a write-once memory (WOM) encoded data utilized in response to determining the counter value associated with the plurality of memory cells is above a threshold;
receiving the WOM encoded data at a buffer;
transferring the WOM encoded data from the buffer to a WOM decoder; and
decoding the WOM encoded data with the WOM decoder.

24. The method of claim 23, wherein decoding the WOM encoded data with the WOM decoder comprises utilizing a lookup table.

25. The method of claim 23, wherein decoding the WOM encoded data with the WOM decoder comprises utilizing a counter value.

26. The method of claim 23, further comprising providing the decoded WOM encoded data to a controller.

* * * * *